United States Patent [19]
Carroll et al.

[11] Patent Number: 5,128,579
[45] Date of Patent: Jul. 7, 1992

[54] ACT ELECTRODE CONFIGURATION FOR LINEAR READOUT

[75] Inventors: Roger D. Carroll, Willimantic; Sears W. Merritt, Glastonbury; Donald E. Cullen, Manchester; Emilio J. Branciforte, Cromwell; William J. Tanski, Glastonbury, all of Conn.

[73] Assignee: United Technologies Corporation, Hartford, Conn.

[21] Appl. No.: 591,581

[22] Filed: Oct. 2, 1990

[51] Int. Cl.⁵ .............................. H01L 41/08
[52] U.S. Cl. .............. 310/313 B; 310/313 R; 310/313 D
[58] Field of Search ........... 310/313 R, 313 A, 313 B, 310/313 D; 333/150, 153, 154, 193, 195

[56] References Cited

U.S. PATENT DOCUMENTS

| | | | |
|---|---|---|---|
| 4,016,412 | 4/1977 | Stern et al. | 310/313 R X |
| 4,055,758 | 10/1977 | Stern et al. | 310/313 R X |
| 4,233,573 | 11/1980 | Grudkowski | 310/313 R X |
| 4,600,853 | 7/1986 | Whitlock et al. | 310/313 B |
| 4,884,001 | 11/1989 | Sacks et al. | 310/313 R X |
| 4,926,146 | 5/1990 | Yen et al. | 310/313 B X |
| 4,990,814 | 2/1991 | Tanski et al. | 310/313 R |
| 5,047,363 | 9/1991 | Hickernell et al. | 310/313 R X |

Primary Examiner—Mark O. Budd

[57] ABSTRACT

An acoustic charge transport device having a number of signal tap electrodes has revealed unexpected insensitivity to electrode spacing and unexpected sensitivity to electrode width. Spacing of one-half SAW wavelength between consecutive electrodes and an electrode width of $\lambda/20$ are preferred for low frequency response.

5 Claims, 2 Drawing Sheets

ACT ELECTRODE CONFIGURATION FOR LINEAR READOUT

TECHNICAL FIELD

The field of the invention is that of acoustic charge transport devices and the electrode configurations therefor.

BACKGROUND ART

Early work in acoustic charge transport (ACT) and heterostructure acoustic charge transport (HACT) devices employed simple delay lines in which a single input electrode and a single output electrode were set for some desired time delay.

More complex electrode configurations for more advanced signal processing were contemplated but the art was aware of potential drawbacks. Even though there is no physical transport of electrons from the charge transport layer into the sensing electrodes, there is still potential for modification of the SAW itself and consequent adverse impact on the signals being carried by the electron packets. In particular, a spacing of electrodes at one SAW wavelength would be analogous to a Bragg diffraction grating used in optical devices. The art would expect a considerable amount of reflection of the SAW and other perturbations of the SAW and the electron packets. It would be expected that integral multiples of the SAW wavelength would also give rise to relatively high reflectivity.

Prior work employed electrodes spaced a considerable distance from the surface, which reduced electron perturbation, but decreased the signal coupling to the tap electrodes and decreased the frequency response.

The need for ground electrodes alternating with signal electrodes also was not appreciated by the art.

DISCLOSURE OF THE INVENTION

The invention relates to an electrode configuration for SAW devices in which alternate signal and reference electrodes are spaced by one-half SAW wavelength, which is the spacing of a SAW generator or detector. Reflectivity of the SAW is minimized by appropriate fabrication of the individual electrodes.

Other features and advantages will be apparent from the specification and claims and from the accompanying drawings which illustrate an embodiment of the invention.

BEST MODE OF CARRYING OUT THE INVENTION

Figure 1:
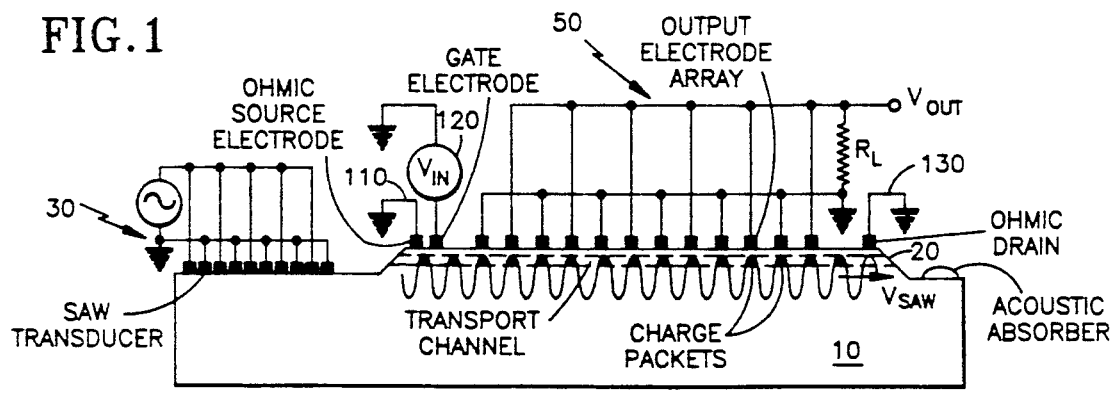
FIG. 1 illustrates an overall view of a SAW device.

Referring now to FIG. 1, there is shown schematically a HACT device in which SAW transducer 30 generates a SAW wave travelling along charge transport channel 20 to the right in the drawing. A source electrode 110 injects electrons into the transport channel where they are picked up by the SAW and carried along in charge packets that are denoted by black shading in the figure. *The input signal on gate electrode 120 controls the number of charges per packet. An ohmic drain electrode 130 drains off the charge at the far end of the SAW channel. The subject of the invention is the electrode array denoted generally by the numeral 50 which it is desired to include for advanced signal processing.

Those skilled in the art are aware that the SAW must travel essentially undisturbed or at least with adequate amplitude through the entire electrode array in order to preserve the charge packet integrity and that the acoustic reflectivity of the electrodes must be sufficiently low so that this result is achieved. If the SAW amplitude is diminished, then it will not be able to carry the packets or there will be leakage of charge from one packet to an adjacent packet that will degrade the signal. For significant numbers of electrodes, on the order of magnitude of 1,000, and for a SAW frequency $\geq$ 260 MHz, the requirement on the charge transfer efficiency (CTE) is very high. An efficiency of 0.999 is considered the threshold for acceptable performance in moderate length arrays (having a transit time of about 1 microsecond) and an efficiency of greater than 0.9999 is considered to be a requirement for very long arrays (about 10 microseconds). There may, of course, be applications which involve a short transport channel in which lower efficiency may be tolerated.

An evident danger is that the electrodes will act in a similar fashion to a Bragg diffraction grating, well known in the integrated circuit and microelectronics fields. These distributed diffraction gratings have spacings of one wavelength and, while each individual perturbation in the index of refraction has a low reflectivity, they accumulate to form reflectivities that are quite substantial. An electrode spacing of one wavelength therefore has an obvious danger.

Another danger that the art was aware of was that an extensive amount of metal in contact with the surface, such as that used in the prior ACT work, will short out the SAW wave at the surface, so that a thick charge transport layer is necessary to get the electrons deep enough in the material so that the SAW is adequate.

In the usual method of construction of ACTs, such as that illustrated in FIG. 1, the electrodes are separated by a fairly large amount from the transport channel. In a conventional ACT, bias electrodes on the surface of the semiconductor are used to direct the electron packets away from the top surface. The electron packets are centered at a depth of $\sim \lambda/4$ and the layer has a thickness of $\sim \lambda/2$. In these prior art devices, the electron packets were relatively resistant to perturbation from the electrodes simply because of distance. The signal coupling efficiency decreases as the electrodes are spaced further away, of course, as does the frequency response of the device. It would be desirable to be able to locate the electrons close to the surface and still have minimal perturbation of the SAW.

No ground or reference electrodes were used in the early work, but the electrodes were able to "see" several charge packets and capacitive coupling to other electrodes connects signals on adjacent electrodes, which degraded the signal response. It has proven necessary for good signal quality to have a ground electrode between the signal electrodes in order to shield the signal electrode from other charge packets and other signal electrodes.

Early ACT work used continuous metal electrodes for charge confinement, so those skilled in the art knew that it was possible to make such devices with a great deal of metal on the surface and were not aware of the sensitivity to the amount of surface area covered by metal that is characteristic of HACT devices.

Figure 2:
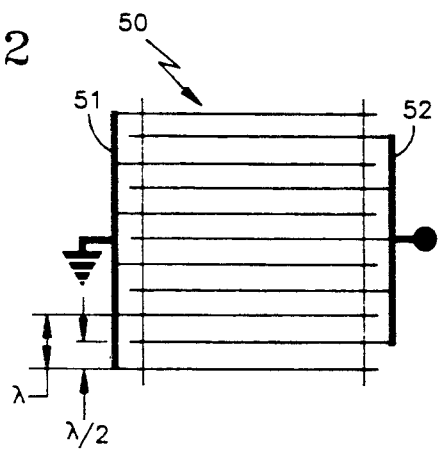
FIG. 2 illustrates an electrode configuration according to the invention.

Referring now to FIG. 2, there is shown in FIG. 2A a schematic of an electrode array 50 in which a set of signal tap electrodes 52 are spaced at intervals of $\lambda$ and these electrodes alternate with an array 51 of reference electrodes which are at the ground so that a set of signal electrodes and a set of reference electrodes alternate with a spacing of $\lambda/2$. These two sets of electrodes will be connected to a load as shown in FIG. 1. The load may be a simple resistor or it may be a differential amplifier.

Those skilled in the art will realize that this spacing is just that used for a SAW transducer or detector. Since the transducers are designed to generate SAWs efficiently and detectors are designed to absorb them efficiently, it is evident that this electrode configuration will absorb the SAW more strongly than any other.

An important difference between this configuration and a competing, less intrusive configuration having one $\lambda$ separation connected as shown is that when a given charge packet is under a signal electrode, the neighboring charge packets are under the adjacent reference electrodes. The electrical signal on the signal electrode is therefore proportional to the differences between the given charge packet and the two neighboring charge packets. In this invention, the signal electrode is responsive only to the packet under it because the reference electrodes are also shielding electrodes that shield the signal electrode from fields generated by not only the neighboring charge packets but also by the neighboring electrodes. The current in the signal electrode is therefore a function that depends essentially only on the charge in the packet beneath it and the device can therefore respond to DC signals that the one $\lambda$ configuration can not respond to. It is evident, also, that the subject array is much better suited to low-frequency signals than the one $\lambda$ array.

Figure 4:
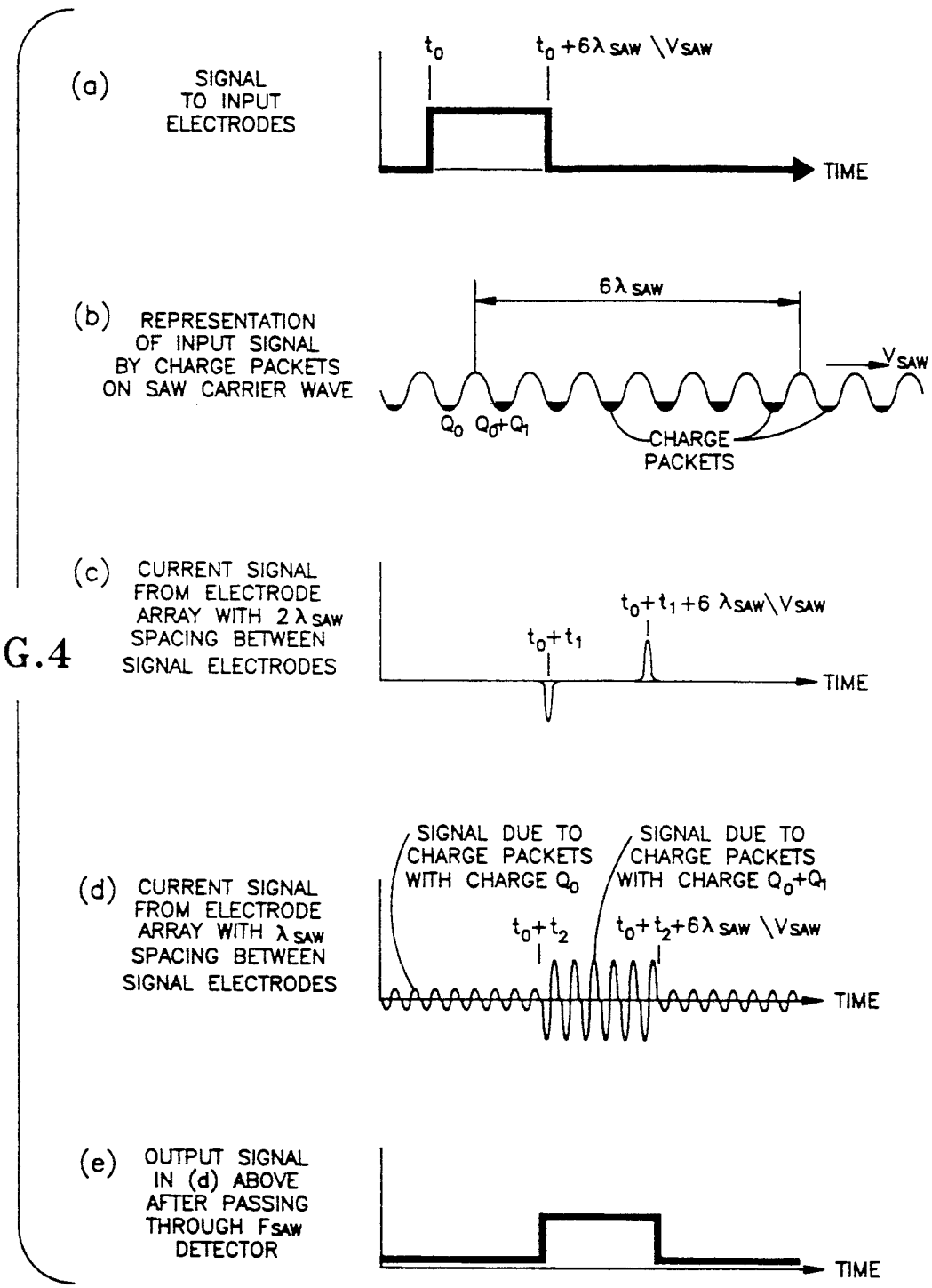
FIG. 4 illustrates the response of different electrode configurations

FIG. 4 illustrates the signal response of electrode arrays spaced at $\lambda$ and at $\lambda/2$. FIG. 4a shows an input square wave having a length of 6$\lambda$ and a duration of 6$\lambda/V_{saw}$. FIG. 4b shows the representation of that square wave on the SAW, with background charge $Q_0$ and the charge representing the amplitude of the square wave being $Q_0 + Q_1$. FIG. 4c shows the signal on the one $\lambda$ electrode configuration, located a delay time $t_1$ after the input time. Note that, since the one $\lambda$ array responds to the difference between the packet under the electrode and the neighboring packets, the square wave produces a response that has two spikes and is zero in between. FIG. 4d, showing the response from the subject array is a pulse train at the SAW frequency and having an envelope related to the input signal and delayed by a second delay time $t_2$. FIG. 4e shows the result of passing the signal of FIG. 4d through an envelope detector to reproduce substantially the input signal. In theory, the signal of FIG. 4c could be integrated to reproduce the input envelope, but it has been found that there are substantial practical difficulties in such an approach and the low frequency response of the $\lambda/2$ array is much better than that of the $\lambda$ array.

Figure 3:
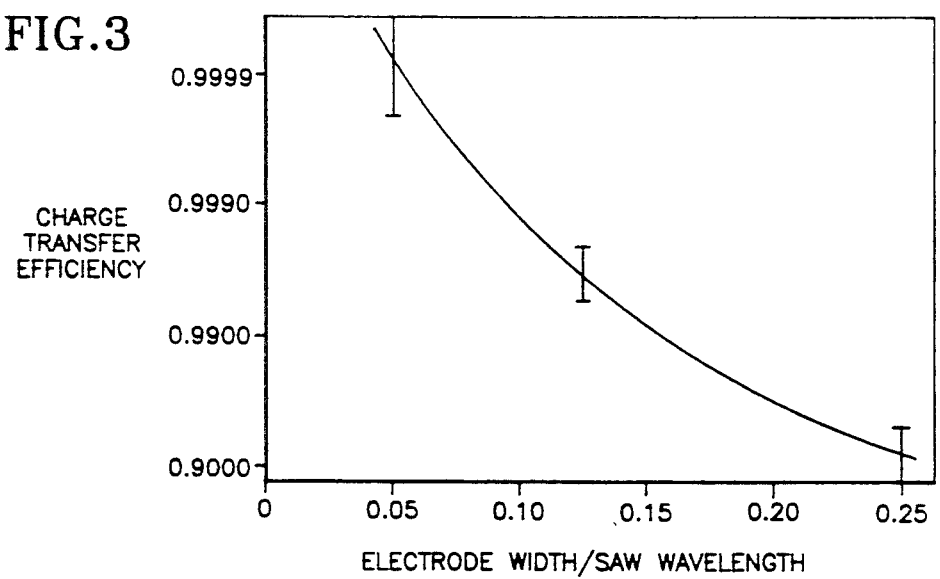
FIG. 3 illustrates the charge transfer efficiency of different electrode widths

Referring now to FIG. 3, there is shown a graph of charge transfer efficiency versus electrode width for a HACT having the electrode surface about 100 nm from the transport channel. The prior art had used electrode widths of $\lambda/4$ which gave a CTE of 0.9000. This is considered unacceptable for the applications intended. An electrode width of $\lambda/8$ is the dividing point for acceptable operations. It has been found that there is an unexpected sensitivity to the electrode width, rather than the electrode thickness or the type of metal in the electrode In order to achieve the desired objective of 0.9999 CTE, it is necessary to shrink the electrode to a value of $\lambda/20$. There will be a tradeoff between low perturbation and device yield, of course, since thin electrodes are more likely to have defects. The preferred device width will decrease in time as fabrication technology improves. At the present, a width of 1 micron is a practical limit of fabrication technology, which puts an effective frequency limit of less than 300 MHz on the SAW, for typical device parameters.

The prior art $\lambda/4$ electrodes had employed a triple layer electrode comprising a layer of titanium deposited on the semiconductor surface by electron beam deposition followed by a layer of aluminum and a top layer of titanium. This configuration bonded very well to the semiconductor and was resistant to further processing steps because of the inertness of titanium.

Tests of different electron widths and materials resulted in a choice of a single layer of aluminum having a width of $\lambda/20$ (1 micron in the illustrative devices) and a thickness of 30nm. A set of values of metallization and resistance on a test sample of 1 micron wide lines is shown in Table 1. It can be seen that the resistivity of the electrodes declines sharply between 20nm and 30nm and thereafter decreases slowly.

It should be understood that the invention is not limited to the particular embodiments shown and described herein, but that various changes and modifications may be made without departing from the spirit and scope of this novel concept as defined by the following claims.

TABLE 1

ELECTRODE RESISTANCE VALUES FOR ONE MICRON LINES

| | METALLIZATION SEQUENCE | RESISTANCE (Ohms) |
|---|---|---|
| A | 10 nm Ti-20 nm Al-10 nm Ti | 1300 |
| B | 5 nm Ti-10 nm Al-5 nm Ti | 5000 |
| C | 20 nm Al | 1300 |
| D | 30 nm Al | 700 |
| E | 40 nm Al | 600 |
| F | 50 nm Al | 450 |

We claim:

1. A heterostructure acoustic charge transport device having a charge transport layer of one composition disposed having a top surface and being disposed above a charge confinement layer of a second composition, for carrying charge packets along a channel axis in said charge transport layer from a source electrode to a drain electrode under the influence of a SAW generated by a SAW transducer and having a predetermined SAW wavelength $\lambda$;

a device surface, carrying said source and drain electrodes and a set of signal electrodes, said signal electrodes being divided into a signal set and a reference set, disposed in alternation on said surface with a differential spacing therebetween of substantially $\lambda/2$; and said set of signal electrodes have an electrode width along said channel axis of less than $\lambda/8$.

2. An acoustic charge transport device according to claim 1, in which said device surface is said top surface of said charge transport layer.

3. An acoustic charge transport device according to claim 2, in which said first composition is GaAs and said second composition is (Al,Ga)As.

4. An acoustic charge transport device according to claim 1, in which at least one intermediate layer of said second composition is interposed between said device surface and said top surface of said charge transport layer.

5. An acoustic charge transport device according to claim 4, in which said first composition is GaAs and said second composition is (Al,Ga)As.

* * * * *